(12) United States Patent
Nakamura

(10) Patent No.: US 8,117,603 B2
(45) Date of Patent: Feb. 14, 2012

(54) OPERATION SYNTHESIS SYSTEM

(75) Inventor: Toshihiko Nakamura, Tokyo (JP)

(73) Assignee: NEC Corporation, Tokyo (JP)

( * ) Notice: Subject to any disclaimer, the term of this patent is extended or adjusted under 35 U.S.C. 154(b) by 1189 days.

(21) Appl. No.: 11/898,476

(22) Filed: Sep. 12, 2007

(65) Prior Publication Data
US 2008/0065871 A1 Mar. 13, 2008

(30) Foreign Application Priority Data
Sep. 13, 2006 (JP) .................... 2006-248678

(51) Int. Cl.
*G06F 9/44* (2006.01)
*G06F 9/45* (2006.01)

(52) U.S. Cl. ........ 717/132; 717/131; 717/144; 717/156; 717/160

(58) Field of Classification Search .................... None
See application file for complete search history.

(56) References Cited

U.S. PATENT DOCUMENTS

| 7,152,218 | B2 | 12/2006 | Okada |
| 2005/0289518 | A1 | 12/2005 | Tanimoto et al. |
| 2006/0184779 | A1 * | 8/2006 | Pisek et al. .................... 712/241 |
| 2008/0098336 | A1 | 4/2008 | Tanimoto et al. |

FOREIGN PATENT DOCUMENTS

| JP | 8-44773 A | 2/1996 |
| JP | 2004-326463 A | 11/2004 |
| JP | 2004-326463 A | 11/2004 |
| WO | WO 2004/036463 A1 | 4/2004 |

\* cited by examiner

*Primary Examiner* — Chuck Kendall
(74) *Attorney, Agent, or Firm* — Foley & Lardner LLP (57) ABSTRACT

An operation synthesis system includes a pipeline structure creating section for automatically creating, based on a state number assigned to a skip statement described in a high-level language in a transition to a pipeline operation and the number of cycles required to supply a pipeline with one loop designated by a user or automatically set by the system, a state transition including a loop controller and a loop leaving controller which are capable of conducting pipeline operation. It is therefore possible to transform a loop description described in a high-level language into a description of a circuit in a practical size for pipeline operation.

3 Claims, 11 Drawing Sheets

DII = 1

ORDINARY STATE TRANSITION CREATION RESULT

A;

LOOP:
B;(stage1)

C;(stage2)

D;(stage3)

E;(stage4)

LOOP LEAVING CONTROLLER
if(cond) goto END;
)else goto LOOP;

END:
G;

PIPELINE STRUCTURE STATE TRANSITION CREATION RESULT

A;

LOOP:
if(st[4]){E;} (stage4)

if(st[3]){D;} (stage3)

if(st[2]){C;} (stage2)

if(st[1]){B;} (stage1)

STAGE EXECUTION PART

PIPELINE LOOP LEAVING CONTROLLER
exitloop = st[3] | st[2] | st[1];
if(exitloop){
 st[n] = 0; st1 = 1;
 goto END;
}else{

FLAG CONTROLLER
st[n] = st[n-1];
...
st2 = st1;
st1 = 1;
goto LOOP;

END:
G;

F I G. 5

DII = 2

ORDINARY STATE TRANSITION CREATION RESULT

A;

LOOP:
B; (stage1-1)

C; (stage1-2)

FIRST STAGE

D; (stage2-1)

E; (stage2-2)

if(cond) goto END;
} else goto LOOP;

SECOND STAGE

LOOP LEAVING CONTROLLER

END:
G;

PIPELINE STRUCTURE STATE TRANSITION CREATION RESULT

A;

LOOP:
if(st[1]){B;}
(stage1-1)

st[n]=st[n];
st2 = st2;
st1 = st1;

if(st[2]){D;}
(stage2-1)

PIPELINING FIRST STATE

STAGE EXECUTION PART if(st[1]){C;}
(stage1-2)

if(st[2]){E;}
(stage2-2)

exitloop = st[3] | st[2] | st[1];
if(exitloop){
 st[n] = 0; st1 = 1;
 goto END;
} else {

PIPELINING SECOND STATE

PIPELINE LOOP LEAVING CONTROLLER st[n] = st[n-1];
st2 = st1;
st1 = 1;
goto LOOP;

FLAG CONTROLLER

END:
G;

FIG. 6

DII=1

ORDINARY STATE TRANSITION CREATION RESULT

A;

```
LOOP:
B;(stage1)
```

```
C;(stage2)
```

```
D;(stage3)
if(cond)goto END;
```

```
E;(stage4)
```

LOOP LEAVING CONTROLLER
```
if(cond)goto END;
}else goto LOOP;
```

```
END:
G;
```

PIPELINE STRUCTURE STATE TRANSITION CREATION RESULT

A;

```
LOOP:
if(st[4]){E;}(stage4)
(stage3)
if(st[3]){D;if(cond) brk[3]=1;}
```

STAGE EXECUTION PART
```
if(st[2]){C;}(stage2)
```

```
if(st[1]){B;}(stage1)
```

PIPELINE LOOP LEAVING CONTROLLER
```
exitloop = st[3] | st[2] | st[1];
if(exitloop){
  st[n] = 0; st1 = 1;
  goto END;
}else{
```

FLAG CONTROLLER
```
st[4] = st[3];
st[3] = st[2]&~brk[3];
st[2] = st[1]&~brk[3];
st[1] = st[1]&~brk[3];
goto LOOP;
```

```
END:
G;
```

FIG. 7

DII = 2

ORDINARY STATE TRANSITION CREATION RESULT

- A;
- FIRST STAGE
  - LOOP:
  - B;(stage1-1)
  - C;(stage1-2)
- SECOND STAGE
  - D;(stage2-1)
  - if(c)goto END;
  - E;(stage2-2)
  - LOOP LEAVING CONTROLLER: if(cond)goto END; }else goto LOOP;
- END:
- G;

PIPELINE STRUCTURE STATE TRANSITION CREATION RESULT

- A;
- PIPELINING FIRST STATE
  - STAGE EXECUTION PART:
    - LOOP:
    - if(st[1]){B;} (stage1-1)  |  if(st[2]){D; if(c)brk[3]=1;} (stage2-1)
    - st[2] = st[2]&~brk[3];
    - st[1] = st[1]&~brk[3];
- PIPELINING SECOND STATE
  - if(st[1]){C;} (stage1-2)  |  if(st[2]){E;} (stage2-2)
  - PIPELINE LOOP LEAVING CONTROLLER:
    - exitloop = st[2]!st[1];
    - if(exitloop){
    - st[2] = 0; st1 = 1;
    - goto END;
    - }else{
  - FLAG CONTROLLER:
    - st[2] = st[1]&~brk[3];
    - st[1] = st[1]&~brk[3];
    - goto LOOP;
- END:
- G;

FIG. 8

DII = 1

ORDINARY STATE TRANSITION CREATION RESULT

A;

LOOP:
B;(stage1)

C;(stage2)

(stage3)
do{D;}while(cond);

E;(stage4)

LOOP LEAVING CONTROLLER: if(cond)goto END;
)else goto LOOP;

END:
G;

PIPELINE STRUCTURE STATE TRANSITION CREATION RESULT

A;

if(st[4]){E;}(stage4)

if(st[3]){D;
dow=cond;}(stage3)

STAGE EXECUTION PART: if(st[2]&~dow){C;}(stage2)

LOOP:
if(st[1]&~dow){B;}(stage1)

PIPELINE LOOP LEAVING CONTROLLER:
exitloop = st[3]|st[2]|st[1];
if(exitloop){
  st[n] = 0; st1 = 1;
  goto END;
}else{

FLAG CONTROLLER:
st[4] = st[3]&~dow;
if(~dow)st[3] = st[2];
if(~dow)st[2] = st[1];
if(~dow)st[1] = st[1];
goto LOOP;

END:
G;

OPERATION SYNTHESIS SYSTEM

This application is based upon and claims the benefit of priority from Japanese patent application No. 2006-248678, filed on Sep. 13, 2006, the disclosure of which is incorporated herein in its entirety by reference.

BACKGROUND OF THE INVENTION

1. Field of the Invention

The present invention pertains to an operation synthesis system for automatically creating, by transforming an operation in a program, particularly, a program described in a high-level language such as C language; a hardware description to implement the operation.

2. Description of Related Art

Japanese Patent Laid-Open Publication Ser. No. 2004-326463 describes an example of an operation synthesis system. The conventional system includes a Control Data Flow Graph (CDFG) creation module, a scheduling module, an allocation module, a data path creation module, and a controller creation module.

To convert or to pipeline a loop part of a program into a pipeline part, the operation synthesis system operates as below.

The CDFG creation module is disposed to create a control data flow graph using a description of operation in a C language program or the like including loop processing and non-loop processing. The CDFG creator identifies the loop part and the non-loop part. The loop part is controllable by a loop controller. The loop controller includes a shift-register function for a number of bits equivalent to the number of stages of the pipeline and makes it possible to execute loop processing of which the iteration of loops is not determined in the operation synthesis phase.

Description will now be given of problems of the conventional operation synthesis system.

It is difficult to create pipeline processing based on loop processing including a break statement and/or a do-while statement described in C language.

In the conventional technique, the loop including above description is converted into a loop description not including the break statement and the do-while statement to create pipeline processing for concurrent operation. However, it is required to transform also the algorithm and hence a large number of operation steps are necessary to convert the original description.

The difficulty in the conversion of the loop processing including a break statement and/or a do-while statement into pipeline processing is as follows. To conduct the parallel operation of the pipeline processing created using the loop part, there is required complex control for the loop leaving operation and for the operation in which part or the entire loop is stopped to execute another processing.

To operate at a high speed a loop description of which the iteration of the loop described in C language is determined in the compilation phase, it is difficult to create pipeline processing using the loop description for higher speed operation speed for the following reason. Complicated control is necessary to concurrently execute pipeline processing created on the basis of the loop of which the iteration of the loop is not determined in the program description, and hence the operation speed cannot be easily increased.

According to the related art of the operation synthesis field, a loop description of which the iteration of loop is not determined in the compilation phase is implemented using, for example, a shift register. Since this scheme employs a concrete hardware item, i.e., a shift register, it is difficult to apply the scheme to a parallelizing compiler.

SUMMARY OF THE INVENTION

An exemplary objection of the invention is to provide an operation synthesis system, an operation synthesis method, and a program stored in a computer-readable medium wherein to increase processing performance per unitary time, i.e., throughput, a circuit description of a practical-sized circuit to conduct a pipeline operation of a loop description written in a high-level language is automatically created without requiring the user to change the description by herself or himself. The loop description includes a description to leave the loop at an intermediate point thereof and a description in which part or the entire loop is stopped at an intermediate point to execute another processing.

Operation Synthesis System

An operation synthesis system according to an exemplary aspect of the invention includes a pipeline structure creating section that automatically creates, based on a state number assigned to a skip statement described in a high-level language in a transition to a pipeline operation and the number of cycles required to supply a pipeline with one loop designated by a user or automatically set by the system, a state transition including a loop controller and a loop leaving controller that conducts pipeline operation.

Operation Synthesis Method

An operation synthesis method according to an exemplary aspect of the invention includes a pipeline structure creating step of automatically creating, based on a state number assigned to a skip statement described in a high-level language in a transition to a pipeline operation and the number of cycles required to supply a pipeline with one loop designated by a user or automatically set by the system, a state transition including a loop step and a loop leaving control step that conducts pipeline operation.

Program

A program stored on a computer-readable medium according to an exemplary aspect of the invention causes a computer to perform pipeline structure creation processing for automatically creating, based on a state number assigned to a skip statement described in a high-level language in a transition to a pipeline operation and the number of cycles required to supply a pipeline with one loop designated by a user or automatically set by the system, a state transition including a loop controller and a loop leaving controller that conducts pipeline operation.

BRIEF DESCRIPTION OF THE DRAWINGS

The objects and features of the present invention will become more apparent from the consideration of the following detailed description taken in conjunction with the accompanying drawings in which.

DESCRIPTION OF EXEMPLARY EMBODIMENTS

Referring next to the accompanying drawings, description will be given of a first exemplary embodiment in accordance with the present invention.

Figure 1:
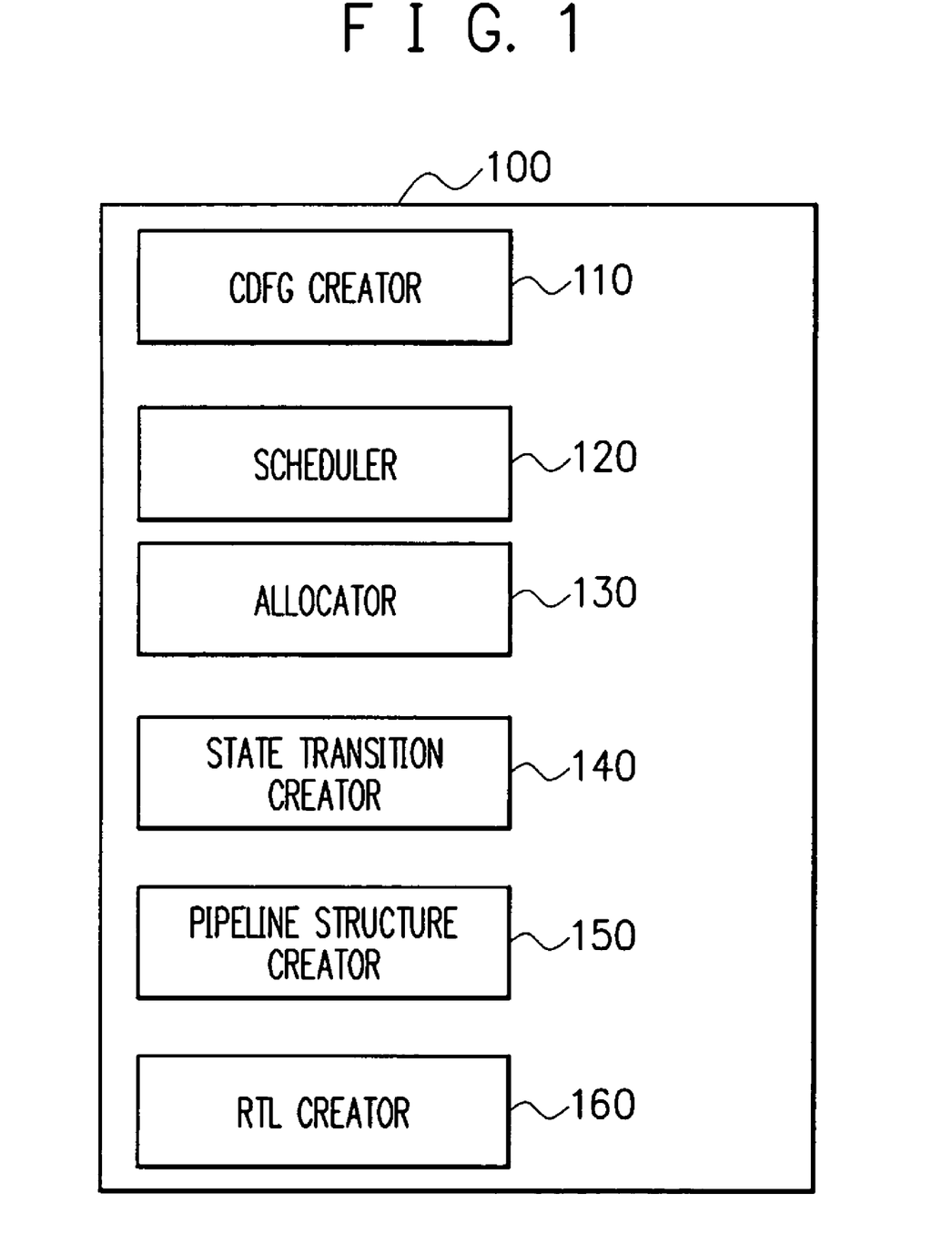
FIG. 1 is a schematic block diagram showing a configuration of a first exemplary embodiment in accordance with the present invention.

Referring to FIG. 1, in the operation synthesis system, a computer (a central processing unit, a processor, a data processing apparatus) 100 that operates under control of a program includes a CDFG creator 110, a scheduler 120, an allocator 130, a state transition creator 140, a pipeline structure creator 150, and a Resistor-Transistor Logic (RTL) creator 160.

The CDFG creator 110 produces a Control Data Flow Graph (CDFG) including information capable of identifying that the associated description is a loop description. The loop information also includes a designation item regarding "user designated pipeline creation is to be conducted or not". The CDFG is also created for a go-to statement and/or a do-while statement, the CDFG being capable of identifying each associated statement.

The scheduler 120, the allocator 130, and the state transition creator 140 may be configured without giving consideration to the pipeline creation.

In the pipelining operation, the pipeline structure creator 150 generates a pipelined state transition, a stage flag controller, and a loop leaving controller on the basis of DII designated by the user or automatically determined by the system and state numbers respectively of the go-to statement and the do-while statement generated by the state transition creator 140.

The RTL creator 160 produces an RTL description based on the state transition generated as above.

Figure 2:
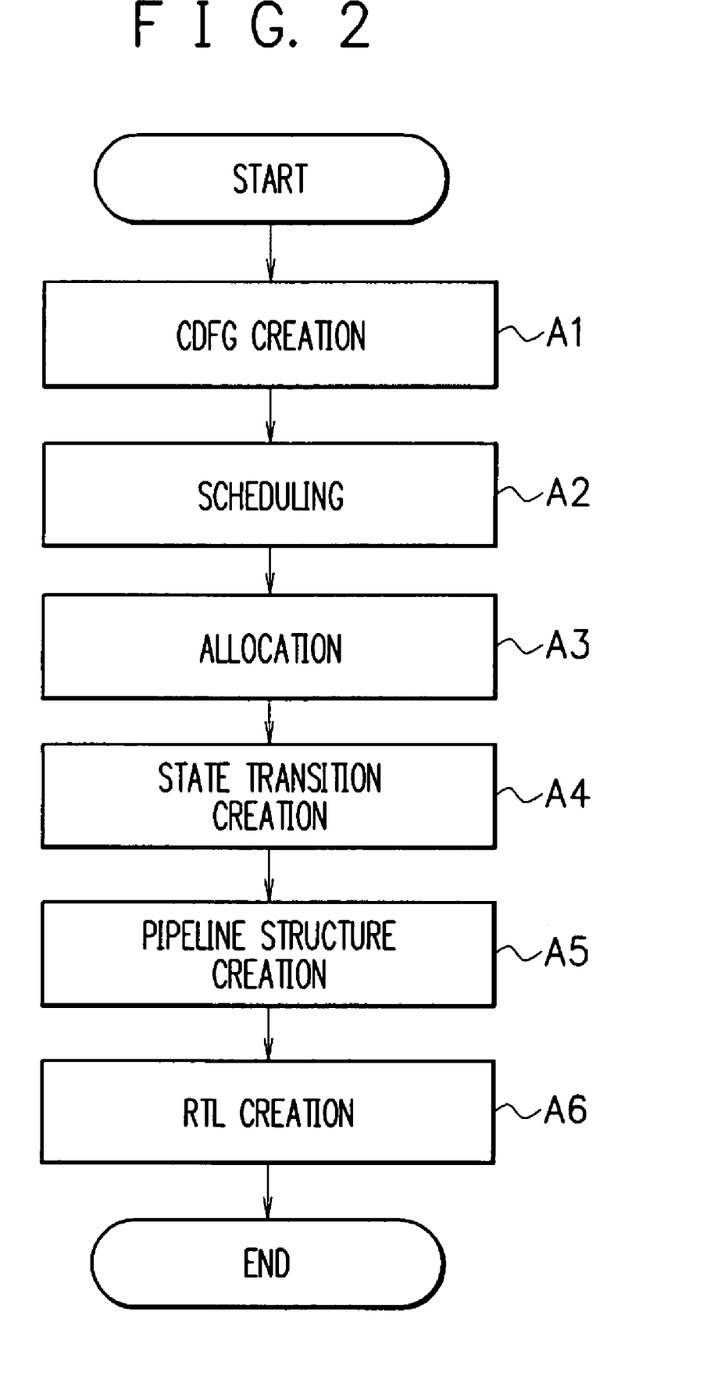
FIG. 2 is a flowchart showing operation conducted in the first exemplary embodiment.

Referring next to FIG. 2, description will be given of operation.

First, the system receives as an input a program language such as C language described by a user, and then the CDFG creator 110 accordingly generates a control data flow graph (step A1).

The scheduler 120 then conducts a scheduling process (step A2) and the allocator 130 allocates registers and arithmetic units (step A3).

The state transition creator 140 produces a state transition (step A4).

Next, the pipeline structure creator 150 transforms the state transition structure produced by the state transition creator 140 into state transition structure capable of conducting a pipeline operation (step A5).

Finally, the RTL creator 160 produces a description in the RTL language (step A6).

In the embodiment, the skip statement i.e., the break statement and the repeat statement, i.e., the do-while statement in the loop are scheduled so that the state transition creator 140 produces a state transition not conducting the pipeline operation. By use of the state number in the state transition creator 140 and DII designated by the user or automatically created by the system, the state transition is transformed into a controller capable of conducting the pipeline operation. Therefore, it is possible to convert each of the break and do-while statements into RTL capable of carrying out the pipeline operation.

The computer 100 holds therein the input items such as a loop description, a loop leaving description, and a loop stop description in an identifiable form. To describe a loop in, for example, C language; the while statement, the for statement, and the do-while statement are employed. An identifier is assigned to each loop description so that the loop is identified when the loop is converted into an internal expression.

The loop leaving description is written in, for example, C language by use of the break statement and the go-to statement. A description equivalent to the loop leaving description is also generally expressed using "break" and "go-to", and then the go-to statement is converted into an internal expression in an identifiable form.

For example, in C language, the function in which part or all of loop processing is temporarily stopped to execute another processing while the loop processing is stopped is described by using the do-while statement. The loop processing written by use of the do-while statement is transformed into an internal expression capable of identifying a loop condition and a body part of the do-while statement.

If the pipelining is designated for the state transition of the loop description generated by the state transition creator 140, the pipeline structure creator 150 converts the state transition into a state transition capable of conducting a pipeline operation. For the go-to statement and the body part of the do-while statement, the pipeline structure creator 150 produces, using the state numbers in the original state transition, a state transition for pipeline operation to which a stage flag controller and a loop leaving controller are added and in which the loop leaving is possible from an intermediate point of the loop and part or all of the loop is interruptible.

The pipeline structure may be in general stepwise altered from a large-sized circuit executing high-speed processing to a small-sized circuit executing low-speed processing. Also in the loop description including the go-to statement and the do-while statement to be processed in the operation synthesis system, the user may designate the variation of the pipeline structure. The system generates the pipeline structure according to the desire of the user.

As a parameter to alter the processing speed of the pipeline structure in the operation to pipeline a loop, Data Initiation Interval (DII) is employed to represent the number of cycles necessary when one loop operation is supplied to the pipeline.

For the state transition of the pipeline structure, the state is divided for each DII beginning at the first state of the loop to obtain DII states. A group of DII states is called a stage.

The DII groups are sequentially assigned with numbers as a first stage, a second stage, and so on beginning at the first DII group of the loop.

The state is folded at each boundary of the stages to overlay states within the stages so that basic pipeline structure is obtained.

However, for the execution of the respective stages, there is additionally employed control in which a stage flag is generated for each stage to execute the stage of which the stage flag is set.

To the loop in the pipeline structure thus constructed, a stage flag controller is added to each state of the loop and a pipeline leaving controller is added to the loop leaving state.

Figure 3:
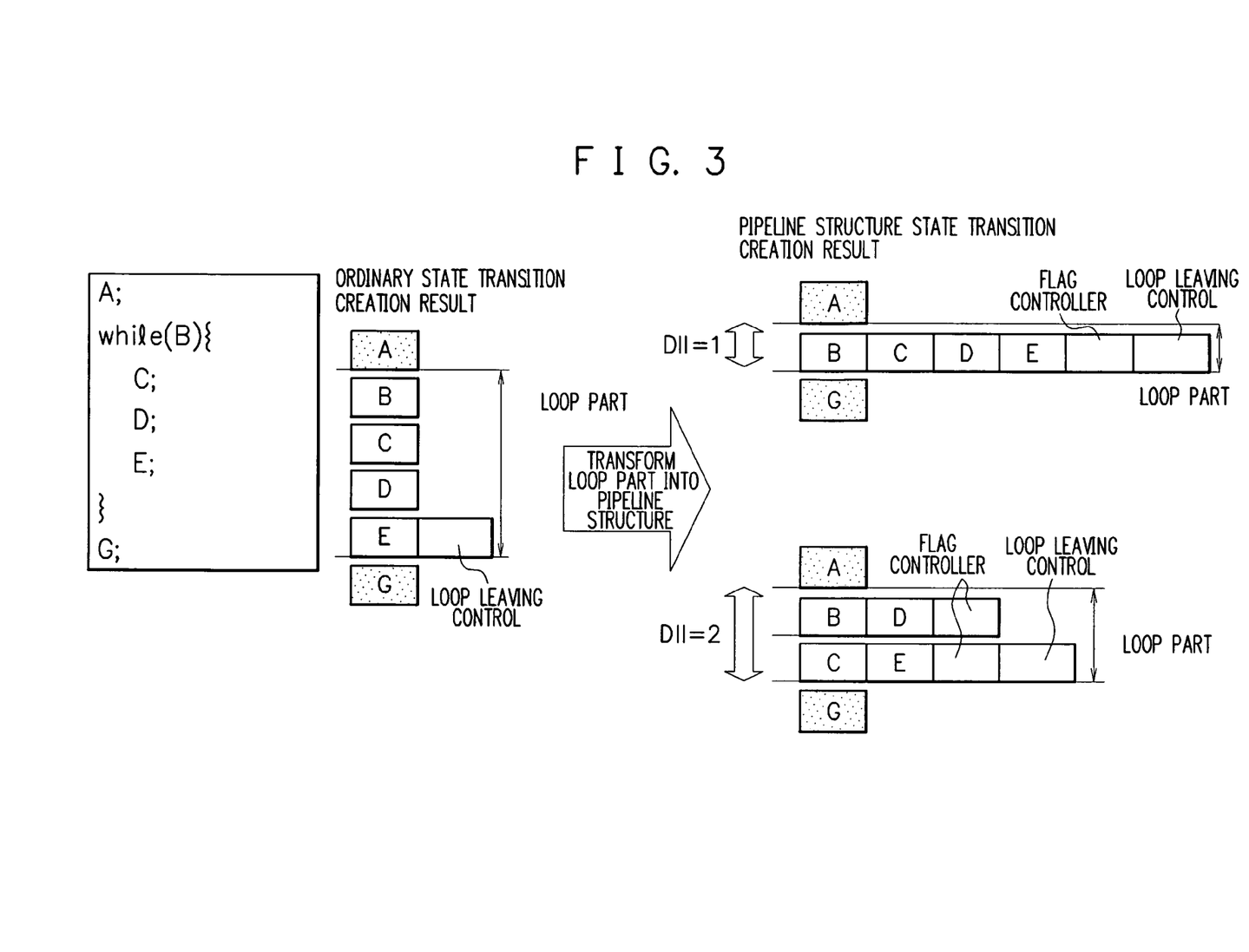
FIG. 3 is a diagram showing an ordinary state transition created using a loop description and a state transition (DII=1, 2) of pipeline structure in the first exemplary embodiment.

FIG. 3 shows the basic conversion. The upper-right corner of FIG. 3 shows structure to conduct the highest-speed pipeline operation as designated DII=1. The lower-right corner is structure to carry out a pipeline operation at a lower speed for DII=2. The stage flag controller of the basic structure includes an operation to assign the value of the stage flag having a small number to the stage flag with a number obtained by adding one to the small number. The pipeline loop leaving controller of the basic structure includes an operation to leave or exit the loop when all stage flags are set to zero.

Figure 4:
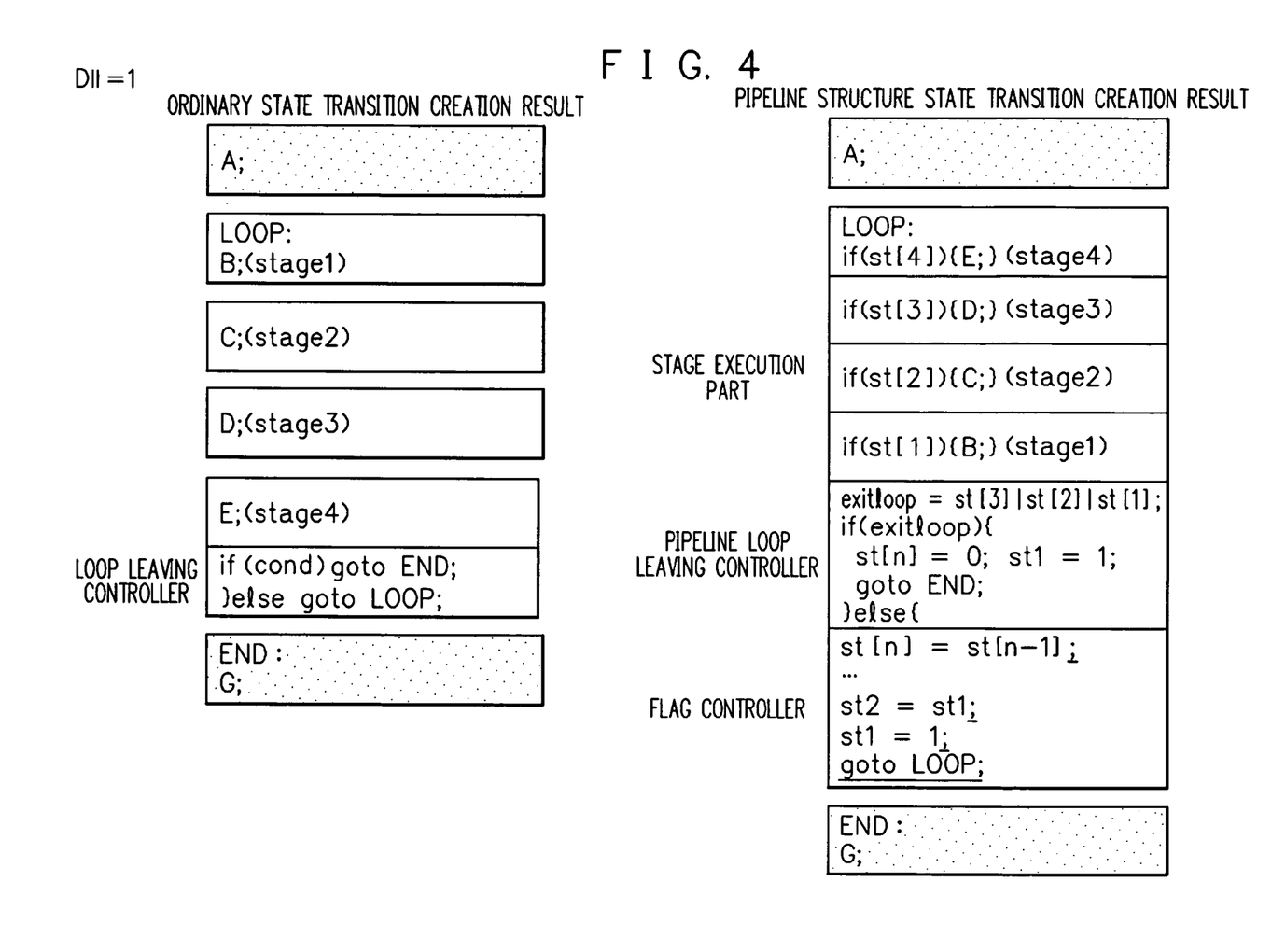
FIG. 4 is a diagram showing in detail the basic pipeline structure of DII=1 generated using a loop description of the first exemplary embodiment.
Figure 5:
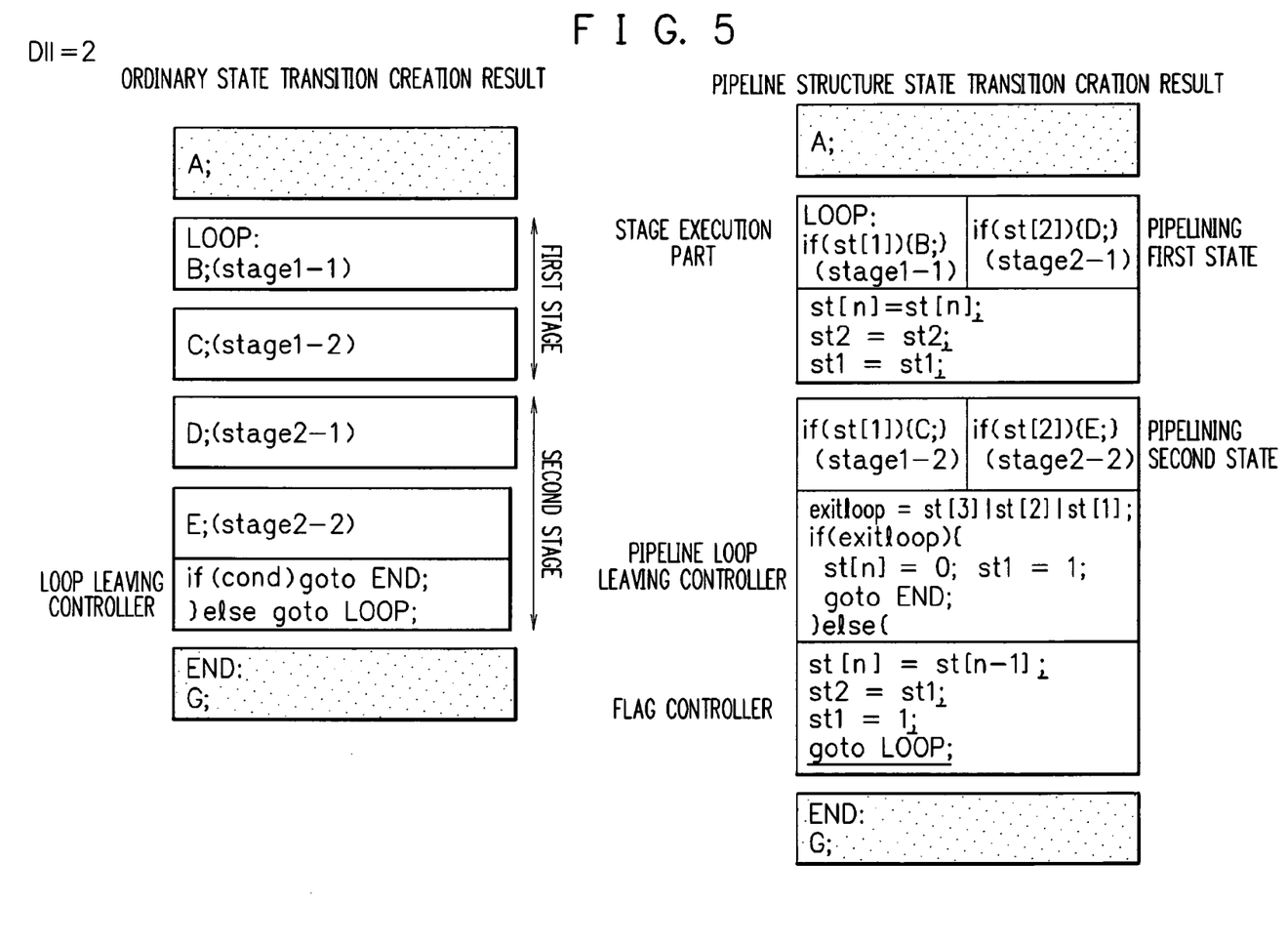
FIG. 5 is a diagram showing in detail the basic pipeline structure of DII=2 produced on the basis of a loop description of the first exemplary embodiment.

FIG. 4 shows the structure of the controller for DII=1 and FIG. 5 shows the structure thereof for DII=2.

To transform a loop operation including the go-to statement into structure capable of conducting the pipeline operation, the following procedures are added to the basic structure.

1. A flag is generated for each go-to statement in the creation of the pipeline structure.
2. The go-to statement is changed to an operation to set the flag.
3. A stage number calculated on the basis of the state number assigned when the go-to statement is scheduled, a state number at creation of the pipeline structure, and a flag name generated using the go-to statement are recorded.
4. In the creation of the flag control part or controller, there is additionally employed a control operation to "&" the go-to flag when a stage flag of a stage number less than that of the go-to statement is produced for the basic structure of the stage flag.
5. A pipelined loop leaving control part or controller is created to be substantially equal to that of the basic structure.

Figure 6:
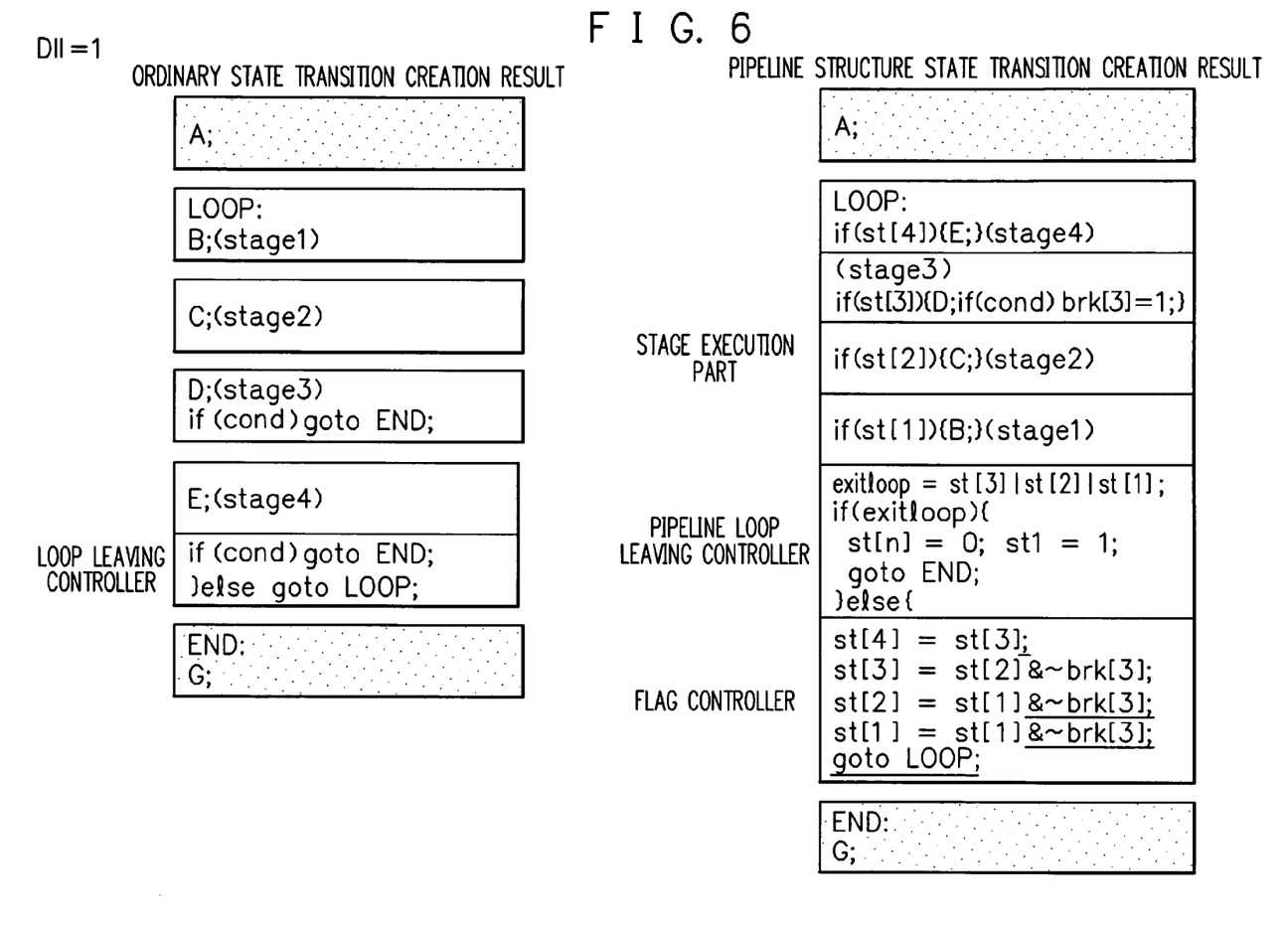
FIG. 6 is a diagram showing in detail the pipeline structure of DII=1 generated using a loop description including "break" of the first exemplary embodiment.
Figure 7:
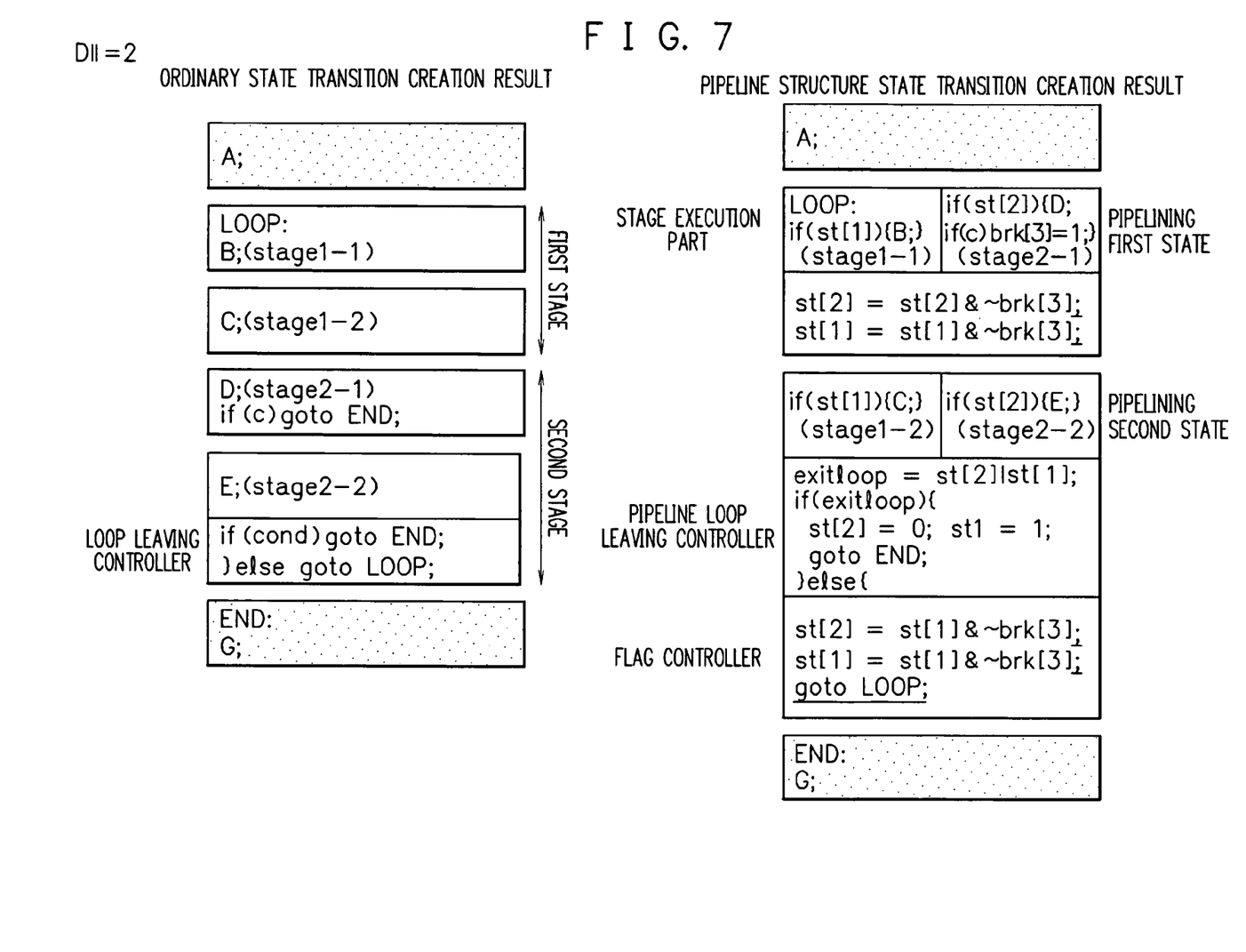
FIG. 7 is a diagram showing in detail the pipeline structure of DII=2 produced using a loop description including "break" of the first exemplary embodiment.

FIG. 6 shows pipeline structure of DII=1 generated as above, and FIG. 7 shows pipeline structure of DII=2 similarly created.

To convert a loop operation including the do-while statement into structure capable of conducting the pipeline operation, the following procedures are added to the basic structure.

1. A flag is generated for each do-while statement in the creation of the pipeline structure.
2. For the do-while statement, the evaluation value thereof is assigned to the flag thus generated.
3. A stage number attained on the basis of the state number assigned when the go-to statement is scheduled, a state number after creation of the pipeline structure, and a flag name generated using the do-while statement are recorded.
4. In the creation of the stage execution part with a number less than that of the do-while statement, a second condition is added to the stage execution control, in addition to a condition that the stage flag is one, the second control being that the do-while flag is zero.
5. In the creation of the flag controller, control is additionally disposed so that the creation of a stage flag value less than the stage number of the do-while statement is carried out only if the do-while flag is zero.
6. In the creation of the flag controller, control is added so that if the do-while flag is zero when a stage flag value larger than the stage number of the do-while statement, the stage flag value is set to zero.
7. A pipelined loop leaving control part or controller is created to be substantially equal to that of the basic structure.

Figure 8:
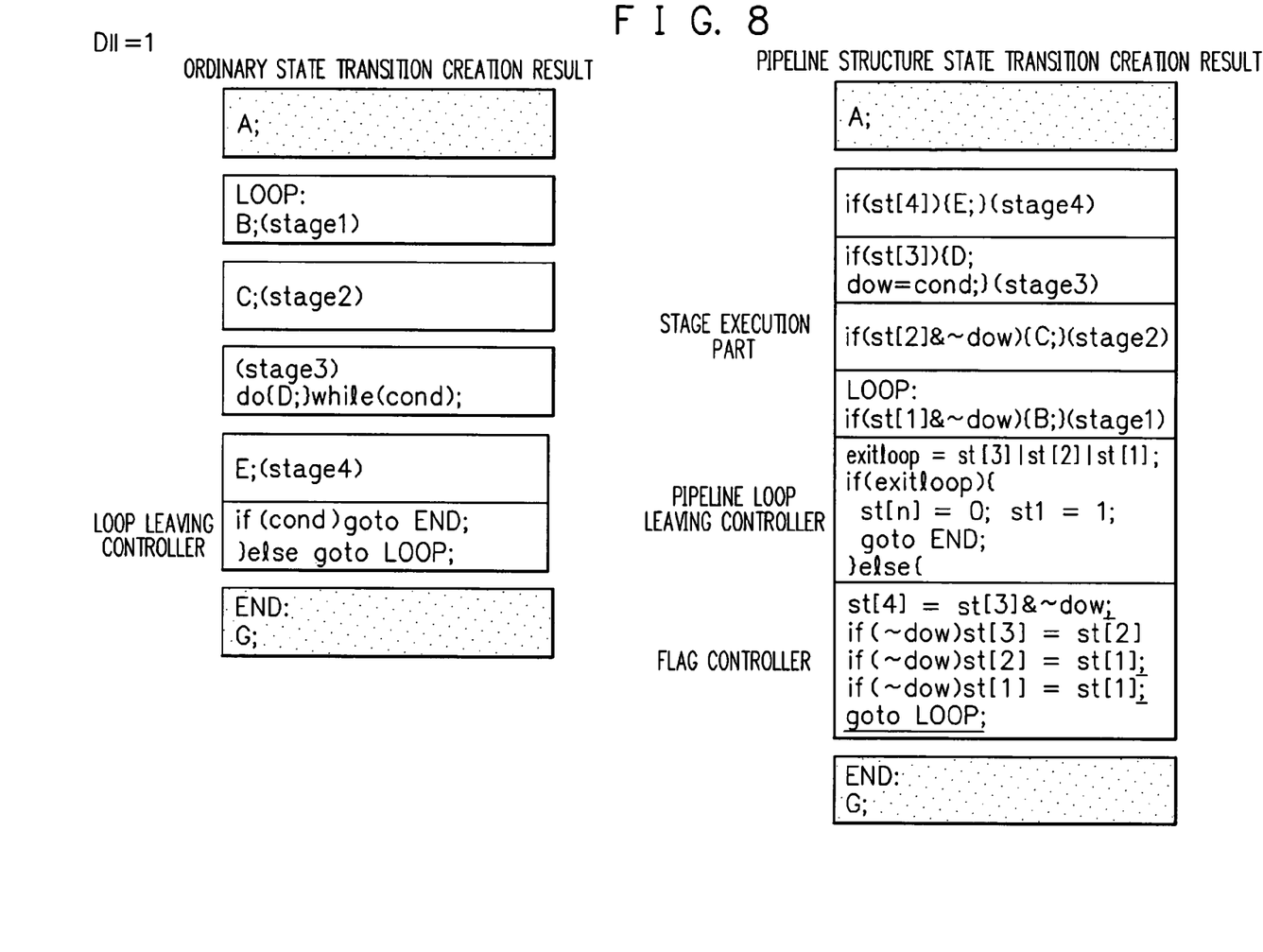
FIG. 8 is a diagram showing in detail the pipeline structure of DII=1 generated using a loop description including "do-while" of the first exemplary embodiment.
Figure 9:
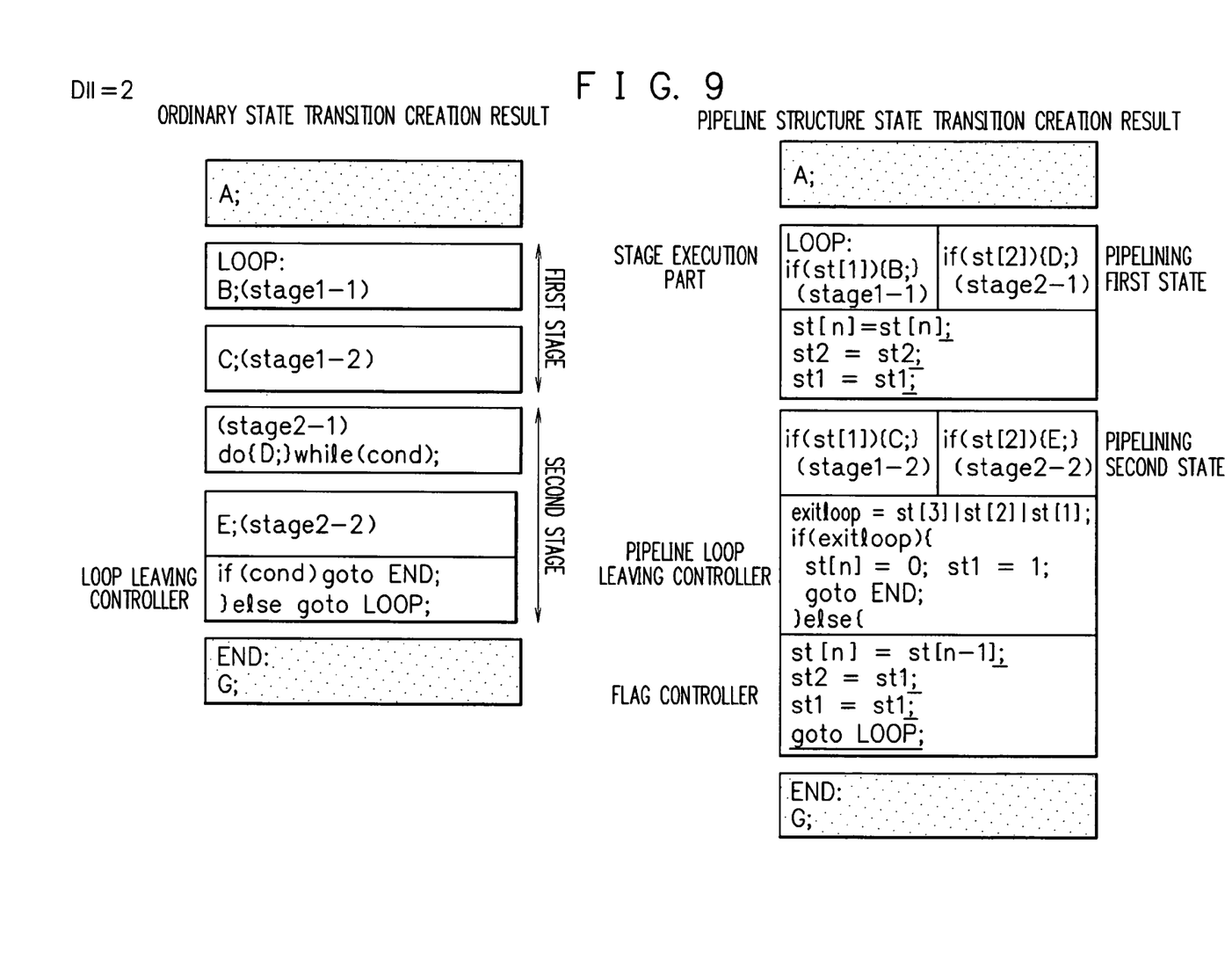
FIG. 9 is a diagram showing in detail the pipeline structure of DII=2 produced using a loop description including "do-while" of the first exemplary embodiment.

FIG. 8 shows the pipeline structure of DII=1 created as above and FIG. 9 shows the pipeline structure of DII=2 similarly produced.

In accordance with this embodiment, a program description including a loop leaving description and a description to interrupt a loop are processed using a smaller number of steps at a higher speed as compared with the conventional art for the following reason. According to the conventional art, if it is required to process at a high speed the loop leaving description or a description to temporarily stop part or all of the loop, the description is required to be modified to execute pipeline processing or it is required to modify an algorithm to execute pipeline processing depending on cases.

According to this exemplary embodiment, a circuit is created that produces pipeline structure of the loop leaving description and a program description including a temporary stop of the loop without any modification thereof. Therefore, only by changing the parameters used in the creation of the pipeline structure, there can be produced, on the basis of one and the same description, a pipeline processing description in which the processing speed and the amount of hardware resources to be consumed are altered for the following reason. In the conventional operation synthesis system, the description including a loop leaving description or a description to temporarily stop part or all of the loop cannot be automatically transformed into pipeline processing. To obtain an RTL circuit description, it is necessary to produce pipeline processing on the basis of an RTL description. In the creation of such pipeline processing using the RTL circuit description, to alter the processing speed and the amount of hardware resources, it is required to modify not only parameters, but also the description is to be changed to a considerable extent.

Next, referring to the drawings, description will be given in detail of the second embodiment in accordance with the present invention.

Figure 10:
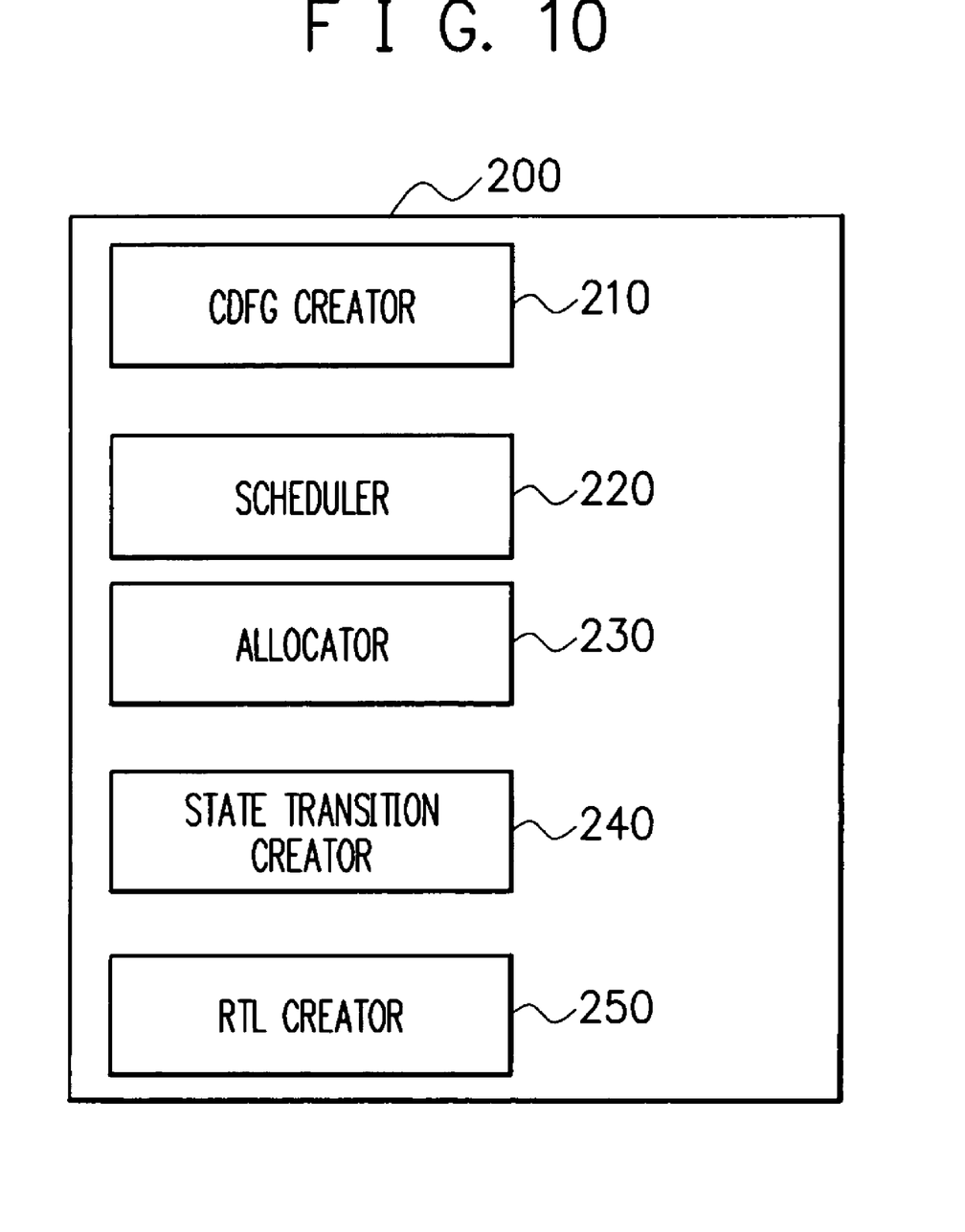
FIG. 10 is a block diagram showing a configuration of a second exemplary embodiment in accordance with the present invention.

Referring now to FIG. 10 showing the first exemplary embodiment of the operation synthesis system, a computer (a central processing unit, a processor, a data processing apparatus) 200 operating under supervision of a program includes a CDFG creator unit 210, a scheduler unit 220, an allocator unit 230, a state transition creator unit 240, and a Resistor-Transistor Logic (RTL) creator unit 250.

The CDFG creator 210 produces a CDFG including information capable of identifying that the associated description is a loop description. The loop information also includes designation regarding "user designated pipeline creation is to be conducted or not". The CDFG is also created for a go-to statement and/or a do-while statement, the CDFG being capable of identifying each associated statement.

The scheduler 220 and the allocator 230 are implementable without giving consideration to the pipelining operation.

The state transition creator 240 generates a state transition by use of the information employed in the scheduling. In the pipelining operation, the state transition creator 240 produces a pipelined state transition, a stage flag controller, and a loop leaving controller according to DII designated by the user or automatically determined by the system and information adopted in the scheduling of the go-to statement and the do-while statement. The RTL creator 250 generates an RTL description on the basis of the state transition generated as above.

Figure 11:
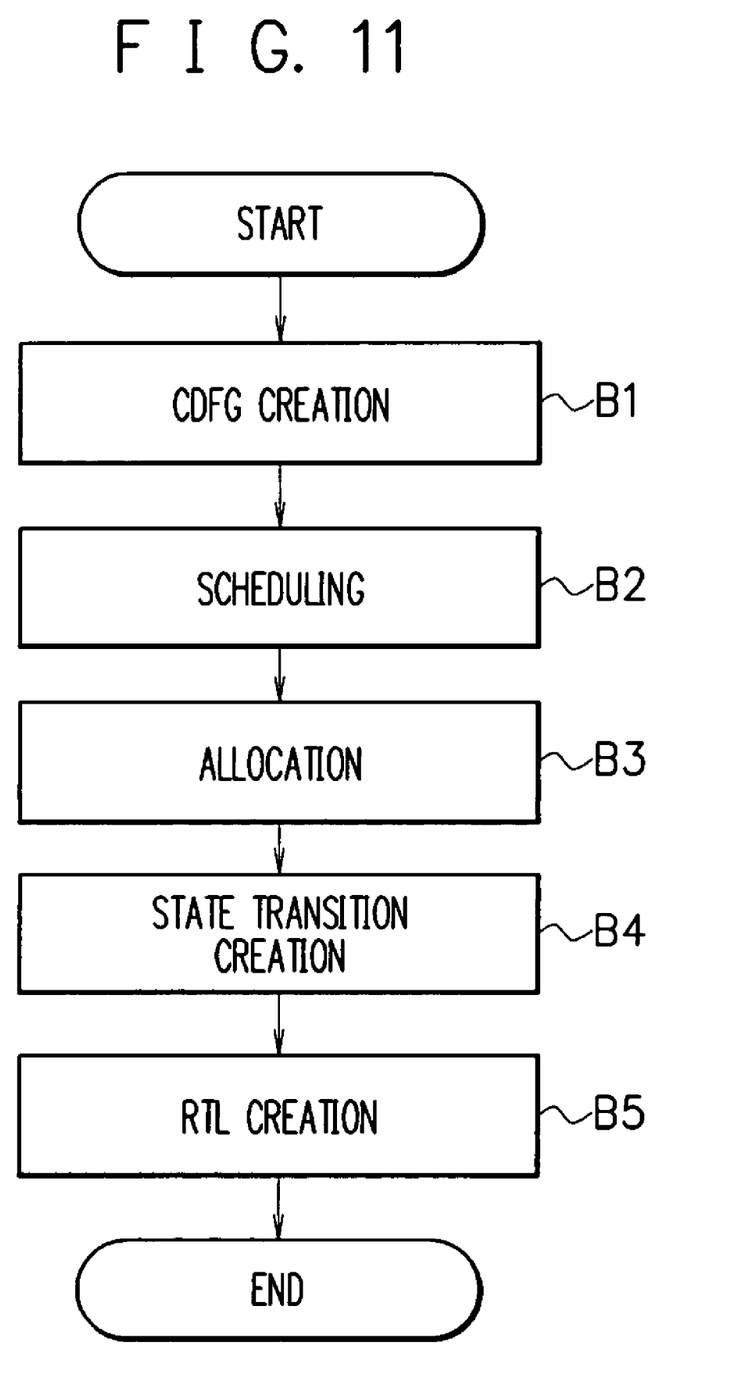
FIG. 11 is a flowchart showing operation conducted in the second exemplary embodiment.

Referring to FIG. 11, description will be given of operation.

The system receives as an input a program language such as C language written by the user. The CDFG creator 210 generates a control data flow graph (step B1).

The scheduler 220 then carries out a scheduling process (step B2).

The allocator 230 allocates registers and arithmetic units (step B3).

The state transition creator 240 produces a state transition (step B4).

Finally, the RTL creator 260 creates a description in the RTL language (step B5).

According to this exemplary embodiment, the break statement and the do-while statement in the loop are first scheduled. By use of the resultantly obtained state number and user setting items or DII automatically created by the system, the state transition creator 240 generates a controller capable of conducting the pipeline operation. Therefore, it is possible to transform the break statement and the do-while statement into RTL capable of performing the pipeline operation.

Incidentally, these exemplary embodiments are only favorable embodiments in accordance with the present invention and may be changed and modified in various ways within a scope of the present invention. There may also be executed, for example, processing in which a program to realize the functions of the computer 100 or 200 is read by the constituent apparatuses to resultantly implement the functions thereof. Additionally, the program may be transmitted to another computer system via a computer-readable recording medium such as a Compact Disk Read Only Memory (CD-ROM) or a magneto-optical disk or via transmission media such as the internet and a telephone communication line using a transmitting wave.

The present invention is applicable to an operation synthesis system to automatically convert a program written in C language or the like into a description of a high-speed circuit. Moreover, the present invention is applicable to an automatic parallelizing compiler or the like in which a program described in C language or the like is replaced by an assembler of a processor capable of executing parallel processing.

In accordance with the present invention, there is obtained, for example, an advantage in which to increase the throughput representing processing performance per unitary time, it is possible to automatically transform a loop description in a high-level language into a description of a circuit in a practical size for pipeline operation. It is hence not necessary for the user to modify the loop description by herself or himself.

As an embodiment, there is provided in accordance with the present invention an operation synthesis system including a pipeline structure creating section for automatically creating, on the basis of a state number assigned to a skip statement described in a high-level language in a transition to a pipeline operation and the number of cycles required to supply a pipeline with one loop designated by a user or automatically set by the system, a state transition including a loop controller and a loop leaving controller which are capable of conducting pipeline operation.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

What is claimed is:

1. An operation synthesis system executed by one or more processors comprising:
   a control data flow graph creator that produces a control data flow graph including information capable of identifying that a part of description is loop description;
   a state transition creator that produces a state transition from said control data flow graph and gives each state a state number; and
   a pipeline structure creator that generates a pipeline structure from said state transition divided into stages, based on a data initiation interval designated by a user or automatically set by the system,
   wherein said pipeline structure creator:
   (1) generates a first flag for each of the stages if there is a loop description in said state transition;
   (2) assigns an evaluation value to said first flag;
   (3) generates a second flag corresponding to each of the stages; and
   (4) generates a stage execution part of the following state of the stage where said loop description is executed, when said first flag is false and said second flag is true.

2. An operation synthesis method, comprising:
   producing a control data flow graph including information capable of identifying that a part of description is loop description;
   producing a state transition from said control data flow graph and giving each state a state number; and
   a pipeline structure creating step that generates a pipeline structure from said state transition divided into stages, based on a data initiation interval designated by a user or automatically set,
   wherein said pipeline structure creating step:
   (1) generates a first flag for each of the stages if there is a loop description in said state transition;
   (2) assigns an evaluation value to said first flag;
   (3) generates a second flag corresponding to each of the stages; and
   (4) generates a stage execution part of the following state of the stage where said loop description is executed, when said first flag is false and said second flag is true.

3. A program stored on a computer-readable storage medium storing a program causing a computer to execute a method comprising:
   producing a control data flow graph including information capable of identifying that a part of description is loop description;
   producing a state transition from said control data flow graph and giving each state a state number; and
   a pipeline structure creating step that generates a pipeline structure from said state transition divided into stages, based on a data initiation interval designated by a user or automatically set,
   wherein said pipeline structure creating step:
   (1) generates a first flag for each of the stages if there is a loop description in said state transition;
   (2) assigns an evaluation value to said first flag;
   (3) generates a second flag corresponding to each of the stages; and
   (4) generates a stage execution part of the following state of the stage where said loop description is executed, when said first flag is false and said second flag is true.

* * * * *